United States Patent
Honcharenko et al.

(10) Patent No.: US 7,030,693 B2
(45) Date of Patent: Apr. 18, 2006

(54) ENHANCED PREDISTORTION METHOD AND APPARATUS

(75) Inventors: Walter Honcharenko, Monmouth Junction, NJ (US); Jaehyeong Kim, Florham Park, NJ (US); Kyriaki Konstantinou, Madison, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/425,725

(22) Filed: Apr. 30, 2003

(65) Prior Publication Data
US 2004/0217810 A1    Nov. 4, 2004

(51) Int. Cl.
*H03F 1/26*    (2006.01)
(52) U.S. Cl. ........................... 330/149; 375/297
(58) Field of Classification Search ............. 330/149, 330/207 P, 298, 289; 375/297; 455/63
See application file for complete search history.

(56) References Cited

U.S. PATENT DOCUMENTS

| | | | |
|---|---|---|---|
| 5,266,906 A * | 11/1993 | Inahashi | 330/149 |
| 6,240,278 B1 * | 5/2001 | Midya et al. | 455/126 |
| 6,342,810 B1 | 1/2002 | Wright et al. | |
| 6,396,327 B1 * | 5/2002 | Lam | 327/317 |
| 6,507,731 B1 | 1/2003 | Hasegawa | |

FOREIGN PATENT DOCUMENTS

| | | |
|---|---|---|
| GB | 2372184 A | 8/2002 |
| JP | 11215198 | 8/1999 |

OTHER PUBLICATIONS

European Search Report Dated Sep. 16, 2004.

* cited by examiner

*Primary Examiner*—Henry Choe

(57) ABSTRACT

A method may include determining a power level of a signal and a temperature level of a transmitter originating the signal. At least one of the power and temperature levels may be compared to a lookup table containing predistortion coefficients. The method is capable of predistorting a signal based on the comparison. An apparatus is disclosed in relation to the method.

15 Claims, 4 Drawing Sheets

ENHANCED PREDISTORTION METHOD AND APPARATUS

BACKGROUND OF THE INVENTION

The present invention generally relates to predistortion methods, in particular, predistortion methods used in conjunction with amplifiers.

Current wideband code division multiple access (W-CDMA) third generation (3G) systems will likely form an infrastructure for mobile speech, video, and high-speed data communications. The number of broadband Internet services is rapidly increasing in fixed networks, and people accustomed to having a broadband environment in their home are now beginning to expect a similarly broadband mobile environment. As a result, the 3G systems are evolving to accommodate more subscribers and provide broadband mobile data communications.

Networks and base transceiver stations (BTSs) for third generation systems have been deployed; however, these BTSs do not have the capabilities needed to provide full 3G mobile services. The next phase of equipment should support greater capacities and faster data services such as high-speed downlink packet access (HSDPA) for W-CDMA and CDMA2000 systems. However, total power consumption of high-capacity BTSs that are required tends to be higher than that of current lower capacity BTSs, because the high-capacity BTSs use more radio frequency (RF) carriers and have more baseband signal processing units. This increased power consumption makes it difficult to implement the high-capacity BTSs using current BTS infrastructure. In particular, the heat produced by the power amplifiers implemented in high-capacity BTSs overwhelms the heat removal capacity of the current BTS infrastructure. Increasing the linearity of the power amplifier used in high-capacity BTSs may allow their use in the current BTS infrastructure.

Ideally, an amplifier provides uniform gain throughout a dynamic range thereof so that the output signal of the amplifier is a correct, amplified version of an input signal. However, in reality, amplifiers exhibit non-ideal properties such as non-linear amplitude and phase distortion, which are undesirable and may deteriorate performance of a system employing the amplifier.

One effect of this is the generation of output frequencies equal to sums and differences of integer multiples of input frequency components. This effect is known as intermodulation distortion (IMD) and is particularly undesirable in high-power radio frequency (RF) amplifiers designed for use in multicarrier or multichannel systems. For example, a broadband amplifier used in a wireless system may generate various undesirable intermodulation products as a result of amplifying a multitude of channels occurring at fixed frequency intervals across a band.

In order to compensate for the non-linearity of an amplifier, the amplifier may be operated in a linear zone. That is, the lower the power level of the amplifier, the smaller the non-linearity manifested by the amplifier. However, this may unnecessarily limit the acceptable operating range of the amplifier, since the amplifier must be operated below maximum power output to avoid undesirable non-linearity.

Another possible linearization method includes using a testing stage applied to an amplifier prior to a field implementation thereof. During the prior testing stage, a test signal may be amplified, a corresponding output signal may be sampled at a fast rate over a short period, and the input signal may be compared with the sampled output signal so as to determine distortion parameters specific to the amplifier at the time the sampling was performed. These distortion parameters, also known as coefficients, may be used to modify an input signal of the amplifier such that an output therefrom is as linear as possible. This technique for compensating for the non-linearity of an amplifier does not take into account how the amplifier's physical operational state may change as the amplifier ages in the field. Moreover, the determined distortion parameters may not be optimum for various amplifier input signals.

SUMMARY OF THE INVENTION

In an exemplary embodiment of the present invention, a current operating state of a transmitter is determined, and based on this determination a signal of the transmitter is predistorted.

In one exemplary embodiment of the present invention, determining the operating state of a transmitter includes determining a power level of a signal and a temperature level of a transmitter originating the signal. The method compares the power and temperature levels with values stored in a lookup table, and predistorts a signal based on the comparison. A signal may be predistorted based on the power level determination or based on both the determined power and temperature levels.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of the exemplary embodiments of the present invention and wherein.

DETAILED DESCRIPTION OF EXEMPLARY EMBODIMENTS

The exemplary embodiments of the present invention described herein are merely illustrative of the present invention. Therefore, the exemplary embodiments should not be considered as limiting of the present invention.

First, a transmitter according to an embodiment of the present invention will be described. Second, a method of predistorting a signal will be described. Finally, alternative embodiments of the present invention will be described.

Transmitter Embodiment

Figure 1:
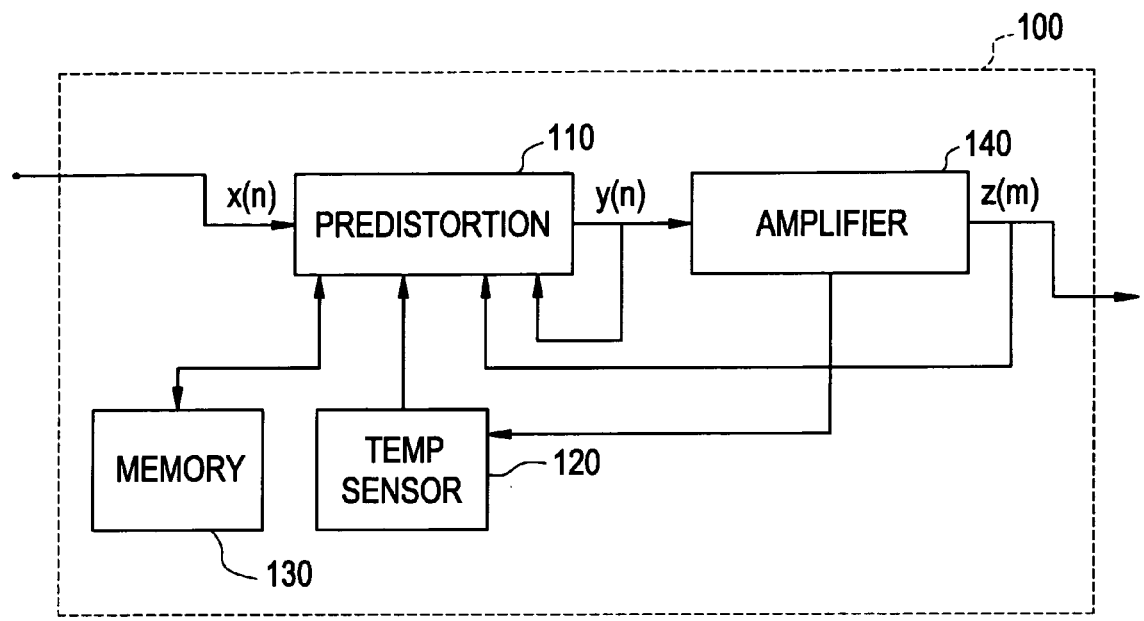
FIG. 1 illustrates a transmitter implementing a predistorting method in accordance with an exemplary embodiment of the present invention.

FIG. 1 illustrates a transmitter 100 implementing a predistorting method in accordance with an exemplary embodiment of the present invention. The transmitter 100 may be implemented in a various number of devices that transmit signals. For example, the transmitter 100 may be used in a base transceiver station (BTS), a transceiver, etc.

The transmitter 100 includes a predistortion block 110, a temperature sensor 120, a memory 130, and an amplifier section 140. A source signal x(n) is input to the transmitter 100 and processed by the predistortion block 110. An initial source signal x(n) may or may not undergo predistortion by the predistortion block 110. That is, the predistortion block 110 may pass the initial source signal x(n) unchanged to the amplifier 140 for amplification and output by the transmitter 100. However, the predistortion block 110 may also predistort the initial source signal x(n) in the predistortion block 110 and/or the memory 130.

Predistortion coefficients may be generally described as complex numbers that may be used to multiply with the source signal x(n) in order to affect an operating range of the source signal x(n).

The predistortion block 110 outputs a predistortion signal y(n) that is a predistorted version of the source signal x(n). The predistortion signal y(n) is received and amplified by the amplifier 140. Thereafter, the amplifier 140 outputs an output signal z(n) having a linear relationship with the input signal x(n). Both the predistortion signal y(n) and the output signal z(n) are fed back to the predistortion block 110 to estimate a predistortion function.

The predistortion block 110 is capable of predistorting the source signal x(n) based upon a power level (averaged or instantaneous) of the predistortion signal y(n) and a temperature value supplied by the temperature sensor 120. The power level of the predistortion signal y(n) and/or the temperature value supplied by the temperature sensor 120 generally define the physical operational state of the transmitter 100. The temperature value is an instantaneous or average temperature value of the amplifier 140, as a sampling by the temperature sensor 120 occurs.

The predistortion block 110 includes a memory (not shown) that stores sets of coefficients for predistorting the source signal x(n) indexed by the temperature value supplied by the temperature sensor 120 and the power level of the predistortion signal y(n). The coefficients stored in the predistortion block 110 pertain to a prior received source signal x(n) that was predistorted thereby. Alternatively, the predistortion block 110 obtains the coefficients for predistorting the input signal x(n) from the memory 130. Accordingly, the source signal x(n) is predistorted in accordance with at least one of the obtained power and temperature values.

Figure 2:
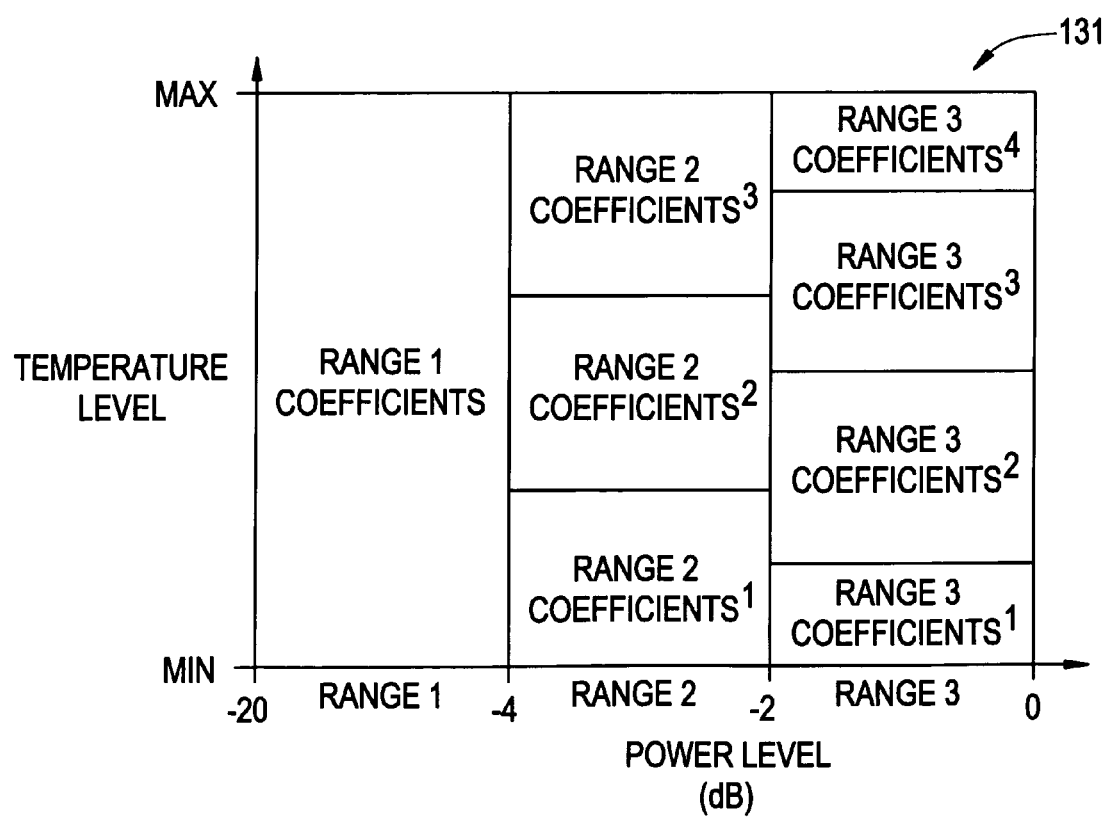
FIG. 2 illustrates a lookup table in accordance with an exemplary embodiment of the present invention.

The memory 130 includes a coefficient lookup table 131, which is illustrated generally in FIG. 2. The lookup table 131 includes coefficients that are associated with various power and temperature levels. Depending on the state of the transmitter 100, that is the current temperature and power levels, the lookup table 131 in the memory 130 is accessed and coefficients are chosen to predistort the source signal x(n).

As is illustrated in FIG. 2, the lookup table 131 includes three power level ranges, which are designated by Range 1, Range 2 and Range 3. These power ranges are designated along the horizontal axis of FIG. 2. The vertical axis of FIG. 2 represents a temperature range. The Range 1 includes one set of coefficients, which are designated as Range 1 Coefficients. The Range 2 includes three sets of coefficients, which are designated as Range 2 Coefficients$^1$, Range 2 Coefficients$^2$ and Range 2 Coefficients$^3$. The Range 3 includes four sets of coefficients, which are designated as Range 3 Coefficients$^1$, Range 3 Coefficients$^2$, Range 3 Coefficients$^3$ and Range 3 Coefficients$^4$.

The power level is obtained from the predistortion signal y(n), and the temperature level is obtained from the temperature sensor 120. As indicated, the combination of the obtained power and temperature level represents the state of the transmitter 100, in particular the amplifier 140. The state is used to choose a set of coefficients from the lookup table 131. For example, if the power level of the predistortion signal y(n) is −6 dB, then the Range 1 Coefficients would be chosen. On the other hand, if the power level of the predistortion signal y(n) is −3 dB, and the temperature sensor 120 detected a temperature level that falls within delimited range of the Range 2 Coefficients$^2$, then the Range 2 Coefficients$^2$ would be chosen to predistort the source signal x(n).

As should be readily apparent to those of ordinary skill in the art, the present invention is not limited to the combination of power ranges and temperature levels illustrated in FIG. 2. Depending on design requirements of any given transmitter and/or amplifier, any number of power ranges and temperature levels may be implemented.

Method of Predistorting A Signal Embodiment

A specific method of predistorting the input signal x(n) according to an exemplary embodiment of the present invention will be discussed in detail in conjunction with FIGS. 3–7.

FIGS. 3–7 illustrate a flowchart of a predistorting method in accordance with an exemplary embodiment of the present invention. The principles of the flowchart illustrated may be realized in hardware and/or software. Although the transmitter 100 illustrated in FIG. 1 will be referred to when discussing functionality of the flowchart illustrated in FIGS. 3–7, it should be understood that this is by way of example only. Therefore, specific references to hardware illustrated in FIG. 1 are not limiting of the present invention.

Figure 3:
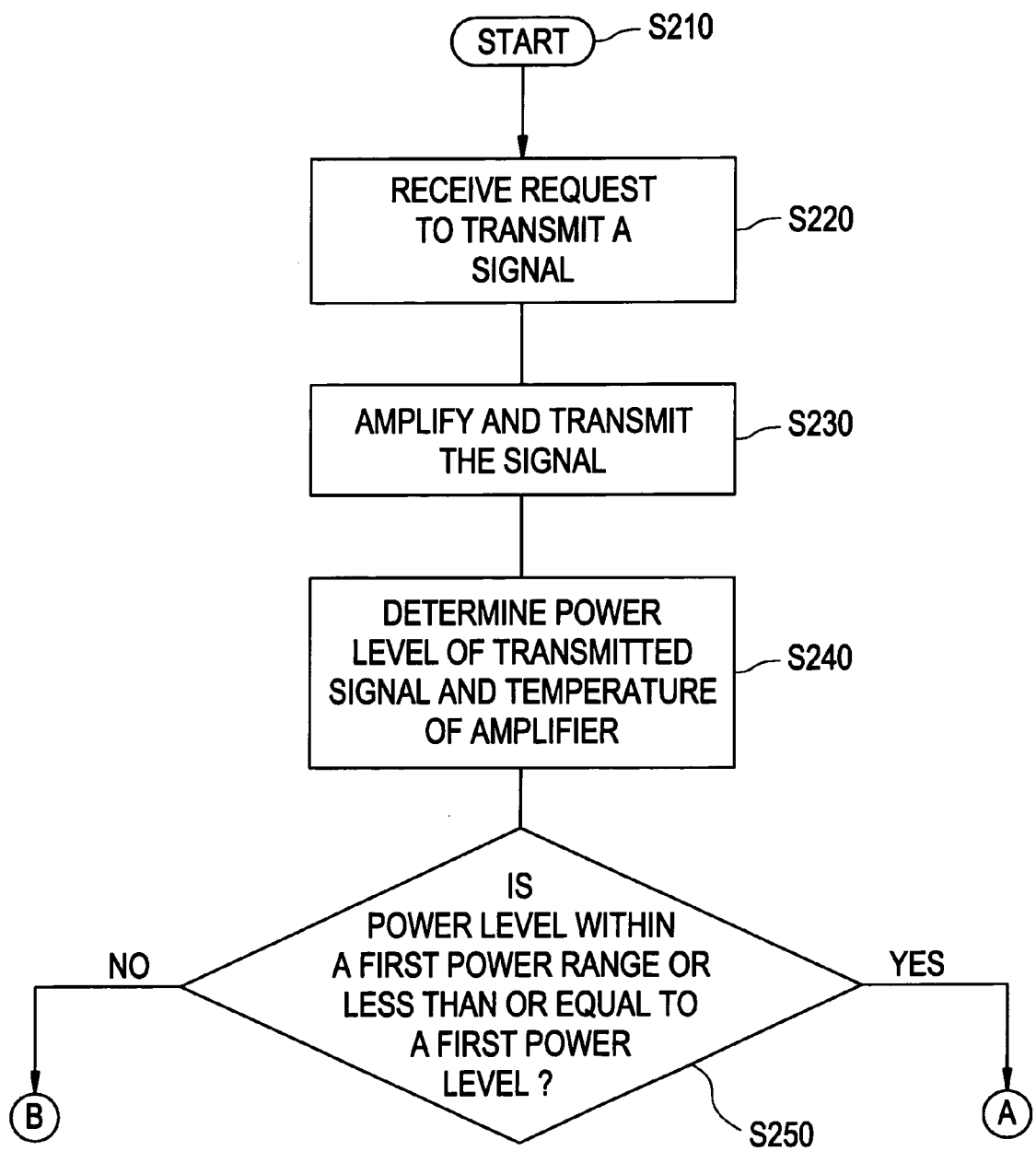
FIG. 3 illustrates a flowchart of a process according to an embodiment of the present invention.

The flowchart of FIG. 3 begins with a start block S210. The start block S210 represents initialization of a process in accordance with an exemplary embodiment of the present invention. Function S220 illustrates a request, received by the transmitter 100, to transmit a signal. In the case of the transmitter 100, the request would result in the production of the output signal z(n). If this is an initial initialization of the transmitter 100, the transmitter may transmit the output signal z(n) without predistortion (Function S230). Using Function S240, a power level of the predistortion signal y(n) and a temperature level of the amplifier 140 may be obtained. The power level of the predistortion signal y(n) may be obtained by a feedback signal to the predistortion block 110, and the temperature level may be provided by the temperature sensor 120.

Next, in Function S250, it is determined whether the determined power level falls within a first power range or is less than or equal to a first power level. For example, whether the power range is within the Range 1. The Range 1 or the first power level is stored in a memory, such as a memory (not shown) of the predistortion block 110 or the lookup table 131 of the memory 130.

Figure 4:
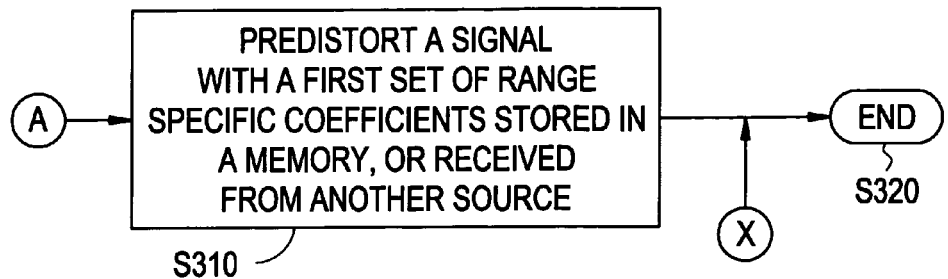
FIG. 4 illustrates a continuation of the flowchart of a process according to an embodiment of the present invention.

FIG. 4 illustrates the process that occurs if the condition of the Function S250 is met. In particular, in Function S310, the predistortion block 110 may predistort an input signal x(n) with a set of coefficients (Range 1 Coefficients) specific to the determined power level (Range 1) of Function S240.

This set of Range 1 Coefficients specific to the determined power level is obtained from a memory of the predistortion block 110 and/or the lookup table 131 of the memory 130. Once Function S310 is processed, the predistort process may end with Function S320.

Figure 5:
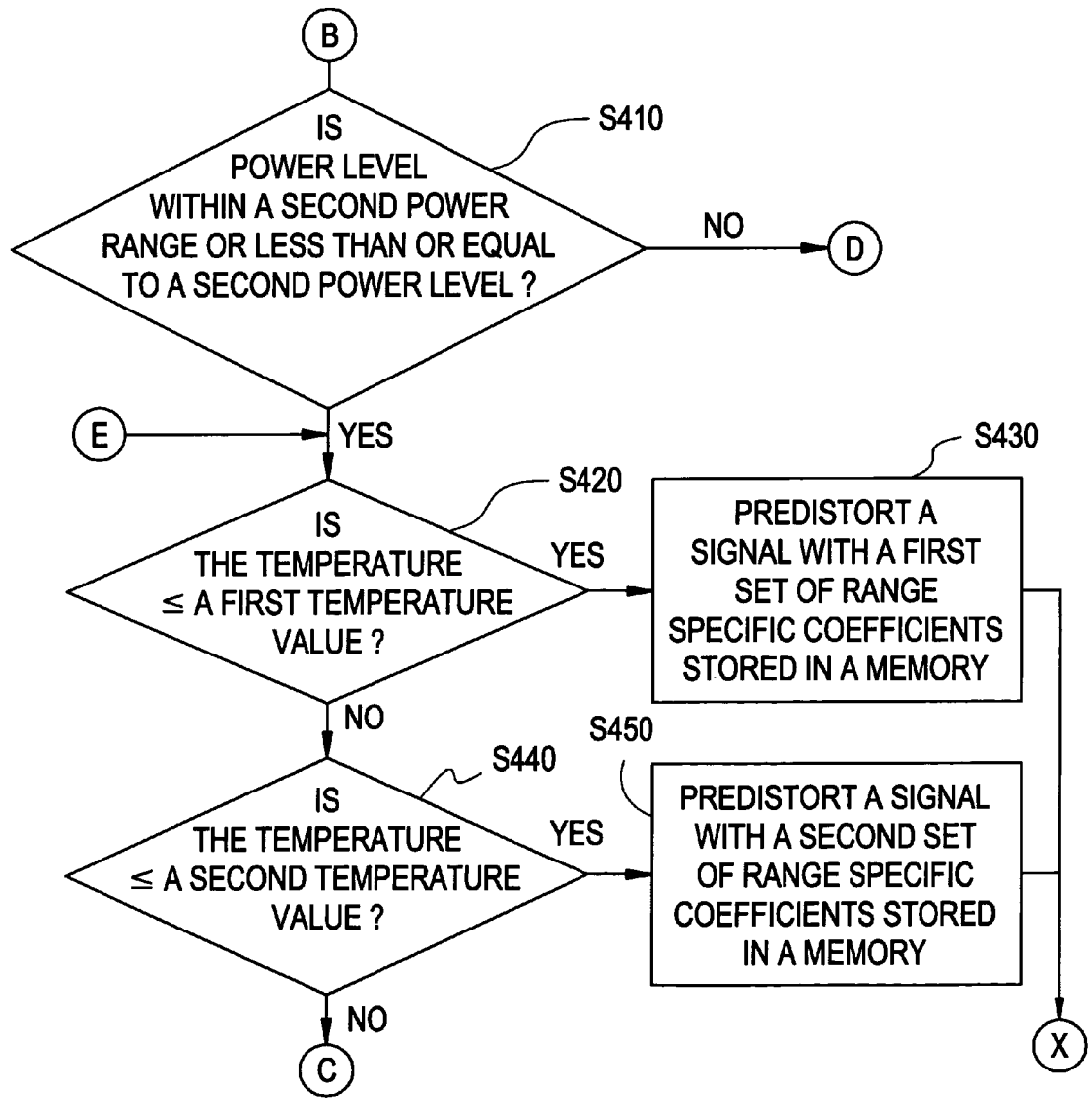
FIG. 5 illustrates a continuation of the flowchart of a process according to an embodiment of the present invention.

However, in the event the condition of the Function S250 is not met, the process illustrated in FIG. 5 is followed. In particular, a Function S410 is used to determine if the determined power level falls within a second power range (Range 2) or is less than or equal to a second power level. The Range 2 or the second power level may be stored in a memory, such as a memory of the predistortion block 110 or the lookup table 131 of the memory 130.

If the condition of Function S410 is met, then the process illustrated in FIG. 5 proceeds to a Function S420. The Function S420 evaluates a temperature level of the amplifier 140, which is detected and supplied to the predistortion block 110 by the temperature sensor 120. In particular, the Function S420 determines if the temperature level is less than or equal to a first temperature value. The first temperature value may be stored in a memory, such as a memory of the predistortion block 110 or the lookup table 131 of the memory 130. If the temperature level is less than or equal to the first temperature value, the predistortion block 110 may predistort an input signal x(n) with a set of coefficients (Range 2 Coefficients$^1$) specific to the power and temperature levels determined in the Function S240 (Function S430). The Range 2 Coefficients$^1$ coefficients specific to the determined power and temperature levels may be obtained from a memory of the predistortion block 110 and/or the lookup table 131 of the memory 130.

However, if the condition of Function S420 is not met, the process illustrated in FIG. 5 proceeds to a Function S440. The Function S440 is capable of determining if the temperature level (from Function S240) is less than or equal to a second temperature value. The second temperature value may be stored in a memory, such as a memory of the predistortion block 110 or the lookup table 131 of the memory 130. If the temperature level is less than or equal to the second temperature value, the predistortion block 110 may predistort an input signal x(n) with a set of coefficients (Range 2 Coefficients$^2$) specific to the power and temperature levels determined in Function S240 (Function S450). The Range 2 Coefficients$^2$ specific to the determined power and temperature levels may be obtained from a memory of the predistortion block 110 and/or the memory 130.

Figure 6:
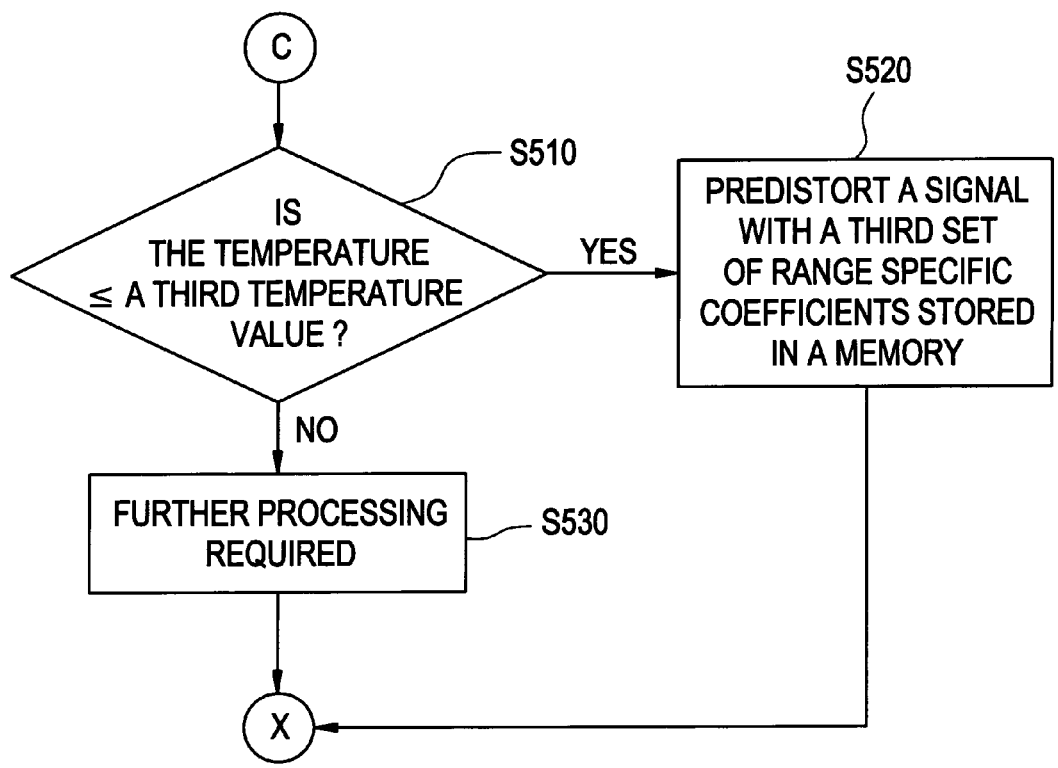
FIG. 6 illustrates a continuation of the flowchart of a process according to an embodiment of the present invention.

If the condition of Function S440 is not met, the process illustrated in FIG. 5 proceeds to the flowchart illustrated in FIG. 6. As is illustrated, a Function S510 is capable of determining if the temperature level (from Function S240) is less than or equal to a third temperature value. The third temperature value may be stored in a memory, such as a memory of the predistortion block 110 or the lookup table 131 of the memory 130. If the temperature level is less than or equal to the third temperature value, the predistortion block 110 may predistort an input signal x(n) with a set of coefficients (Range 2 Coefficients$^3$) specific to the power and temperature levels determined in Function S240 (Function S520). The Range 2 Coefficients$^3$ specific to the determined power and temperature levels may be obtained from a memory of the predistortion block 110 and/or the lookup table 131 of the memory 130.

Otherwise, in the case where the condition of the Function S510 is not met, further processing may be required (Function S530). The further processing may include activating an error indication for signifying a possible error state in the transmitter 100. This error state may signify a temperature condition that could cause damage to the transmitter 100, or a temperature condition that may not be handled or anticipated by the processing code of the transmitter 100.

Figure 7:
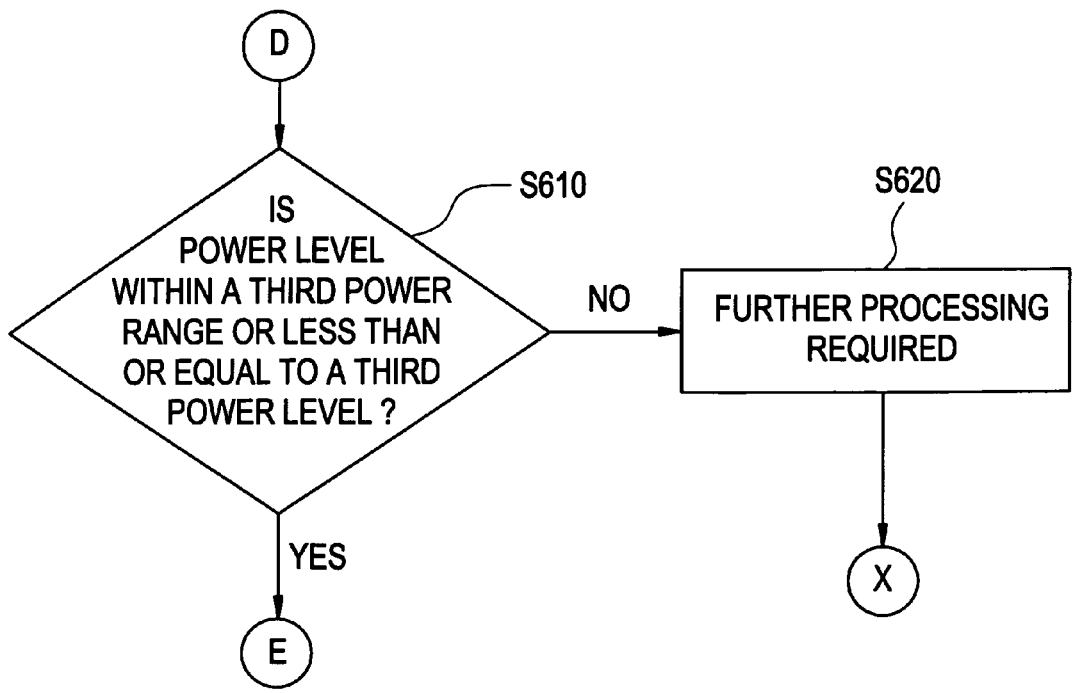
FIG. 7 illustrates a continuation of the flowchart of a process according to an embodiment of the present invention.

FIG. 7 illustrates a flowchart that is followed if the Function S410 of FIG. 4 is not met. In particular, a Function S610 may be used to determine if the determined power level falls within a third power range (Range 3) or is less than or equal to a third power level. The Range 3 or the third power level may be stored in a memory, such as a memory of the predistortion block 110 or the lookup table 131 of the memory 130. If the condition of Function S610 is met, then the process illustrated in FIG. 6 proceeds to the Function S420 and proceeds with therefrom as discussed herein heretofore. However, in the case of the lookup table 131 illustrated in FIG. 2, one additional temperature range, including additional coefficients for predistortion, may be used when predistorting an input signal x(n).

Otherwise, in the case where the condition of the Function S610 is not met, further processing may be required (Function S620). The further processing may include activating an error indication for signifying a possible error state in the transmitter 100. This error state may signify a power level that could cause damage to the transmitter 100, or a power level that may not be handled or anticipated by the processing code of the transmitter 100.

Alternative Embodiments

Although the memory 130 is illustrated as being integrated with the transmitter 100, this is by way of illustration only. That is, the memory 130 may also be operationally connected to the transmitter 100 via another device or element. One such device would be a BTS in communication with the transmitter 100.

Although an exemplary embodiment of the present invention describes obtaining predistortion coefficients in accordance with three power ranges and one, three and four temperature values in each range, respectively, this is by way of illustration only. Other combinations of ranges and temperature values may also be used as desired by design requirements of any given transmitter.

The exemplary embodiments of the present invention being thus described, it will be obvious that the same may be varied in many ways. Such variations are not to be regarded as a departure from the spirit and scope of the exemplary embodiments of the invention, and all such modifications as would be obvious to one skilled in the art are intended to be included within the scope of the following claims.

What is claimed is:

1. A method, comprising:
   predistorting an input signal of a transmitter to generate a predistortion signal for amplification by an amplifier, the predistorting being based on a power level of a generated predistortion signal, a temperature level of the amplifier and an output signal from the amplifier.

2. The method according to claim 1, further comprising:
   accessing a memory to retrieve coefficients for predistorting the signal.

3. The method according to claim 2, wherein accessing includes retrieving the coefficients from a coefficient lookup table stored in the memory.

4. The method according to claim 3, wherein accessing includes retrieving the coefficients from the coefficient lookup table that is indexed according at least one power range and at least one temperature level.

5. The method according to claim 3, wherein accessing includes retrieving the coefficients from the coefficient lookup table that is indexed according three power ranges, a first of the three power ranges includes one defined temperature level, a second of the three power ranges includes two defined temperature levels, and a third of the three power ranges includes four defined temperature levels.

6. An apparatus, comprising:
   a predistorter configured to predistort an input signal of a transmitter to generate a predistortion signal for amplification by an amplifier, the predistoring being based on a power level of a generated predistortion signal, a temperature level of an amplifier and an output signal output from the amplifier.

7. The apparatus according to claim 6, further comprising:
   means for storing coefficients, the means for storing coefficients accessed when the means for predistorting predistorts the input signal according to the determined state.

8. The apparatus according to claim 6, wherein the predistorter is configured to predistort the input signal using at least one coefficient stored in the means for storing.

9. The apparatus according to claim 6, wherein the means for storing coefficients includes a stored lookup table of coefficients indexed based upon both power and temperature.

10. A method, comprising:
    determining a power level of a predistorted input signal;
    determining a temperature level of an amplifier used in a transmitter to amplify the predistorted input signal;
    comparing the determined power and temperature levels to at least one power level threshold and at least one temperature level threshold respectively; and
    predistorting an input signal based on the comparison to generate the predistorted input signal.

11. The method according to claim 10, wherein comparing includes comparing the determined power and temperature levels to a plurality of power level thresholds and a plurality of temperature level thresholds.

12. The method according to claim 11, wherein, if the determined power level is below a first power level threshold, the predistorting step predistorts the input signal with stored coefficients irrespective of the determined temperature level.

13. The method according to claim 11, wherein, if the determined power level is greater than a first power level threshold, the predistorting step predistorts the input signal with stored coefficients in accordance with the determined power level and the determined temperature level.

14. A method, comprising:
    accessing a memory to retrieve coefficients, from a coefficient lookup table, for predistorting a signal based on a current operating state of a transmitter;
    predistorting the signal of the transmitter according to the current operating state of the transmitter; wherein
    the coefficient lookup table is stored in a memory, that is indexed according to three power ranges, a first of the three power ranges including one defined temperature level, a second of the three power ranges including two defined temperature levels, and a third of the three power ranges including four defined temperature levels.

15. The method according to claim 1, further comprising:
    comparing the power and temperature levels to at least one power level threshold and at least one temperature level threshold, respectively; and wherein
    the predistorting step predistorts the input signal based on the comparison.

* * * * *